US 9,320,167 B2

(12) United States Patent
Wang (10) Patent No.: US 9,320,167 B2
(45) Date of Patent: Apr. 19, 2016

(54) ELECTRONIC DEVICE AND CONNECTING UNIT THEREOF

(71) Applicant: AOPEN, INC., New Taipei (TW)

(72) Inventor: Jo Chiao Wang, New Taipei (TW)

(73) Assignee: AOPEN, INC., New Taipei (TW)

( * ) Notice: Subject to any disclaimer, the term of this patent is extended or adjusted under 35 U.S.C. 154(b) by 237 days.

(21) Appl. No.: 14/103,506

(22) Filed: Dec. 11, 2013

(65) Prior Publication Data

US 2014/0355182 A1    Dec. 4, 2014

(30) Foreign Application Priority Data

Jun. 4, 2013    (TW) .............................. 102119778 A (51) Int. Cl.
*H05K 7/14*    (2006.01)

(52) U.S. Cl.
CPC .................. *H05K 7/142* (2013.01); *H05K 7/14* (2013.01); *H05K 7/1417* (2013.01)

(58) Field of Classification Search
CPC ..... G06F 1/203; G06F 1/1628; G06F 1/1635; G06F 1/1658; G06F 1/20; H05K 3/303; H05K 5/0004; H05K 5/0013; H05K 5/0052; H05K 5/0213; H05K 5/0217; H05K 5/061; H05K 7/026; H05K 7/10; H05K 7/1488; H05K 7/1489; H05K 7/1492; H05K 7/20145; H05K 7/2039; H05K 7/20409; H05K 7/20418; H05K 7/20509; H05K 7/20709; H05K 7/20736; H05K 7/20854; H05K 9/0007; H05K 7/1417; H05K 7/14; H05K 7/142
USPC ............. 361/679.01, 679.02, 679.33–679.39, 361/679.48, 724–727, 752; 312/223.1–223.2
See application file for complete search history.

(56) References Cited

U.S. PATENT DOCUMENTS

| 3,299,323 | A | * | 1/1967 | Dudley | ............... | H01R 13/629 361/724 |
| 8,243,452 | B2 |   | 8/2012 | Yang |   |   |
| 2003/0011996 | A1 | * | 1/2003 | Yang | ................... | H01L 23/4006 361/704 |

FOREIGN PATENT DOCUMENTS

| GB | 2350480 A | 11/2000 |
| TW | M379958 U1 | 5/2010 |
| TW | M381097 U1 | 5/2010 |
| TW | 201139864 A1 | 11/2011 |

OTHER PUBLICATIONS

Taiwan Office Action dated May 25, 2015 issued to Taiwan counterpart application No. 102119778 by the Taiwan Intellectual Property Office with sections boxed in red; five (5) pages.
English abridged translation of sections boxed in red in Taiwan Office Action dated May 25, 2015 issued to Taiwan counterpart application No. 102119778; three (3) pages.
English translation of TW M381097 U1; nine (9) pages.
English translation of TW M379958 U1; six (6) pages.
TW 201139864 A1 dated Nov. 16, 2011, including English Abstract; 19 pages.

* cited by examiner

*Primary Examiner* — Anthony Haughton
*Assistant Examiner* — Ingrid Wright
(74) *Attorney, Agent, or Firm* — John A. Fortkort; Fortkort & Houston PC (57) ABSTRACT

A connecting unit for connecting an electronic unit to a housing includes a first connecting component having a fastening hole, a second connecting component including a head and a stem, and a resilient buffering member sleeved on the first connecting component, and having an end that abuts against a board of the electronic unit and that has a mounting hole. A portion of the buffering member is between the first connecting component and the board. The stem extends through the board and the mounting hole to engage the fastening hole, such that the board abuts against the buffering member, and is spaced apart from the first connecting component and the head so as to be movably restricted relative to the housing between the head and the buffering member.

14 Claims, 7 Drawing Sheets

ELECTRONIC DEVICE AND CONNECTING UNIT THEREOF

CROSS REFERENCE TO RELATED APPLICATION

This application claims priority of Taiwanese Patent Application No. 102119778 filed on Jun. 4, 2013.

BACKGROUND OF THE INVENTION

1. Field of the Invention

The invention relates to a connecting unit, more particularly to a connecting unit that can absorb force of an external collision and that can offset component tolerance(s), and to an electronic device incorporating such connecting unit.

2. Description of the Related Art

With the rapid increase in performance efficiency of electronic devices, such as computer hosts, servers, etc., along come increased power consumption and heat generation. Conventionally, fans are installed inside electronic devices for heat dissipation. But where special requirements in terms of space, noise, maintenance procedure are to be met, installation of fans is not viable, and hence a fanless heat dissipation module is used.

Generally speaking, a fanless heat dissipation module includes a plurality of contact surfaces formed on an inner side thereof, a plurality of heat dissipation fins, and a heat pipe connecting the contact surfaces and the heat dissipation fins. The contact surfaces are in intimate contact respectively with heat-generating electronic components of an electronic device to absorb heat generated thereby by virtue of heat conductance for subsequent transmission to the heat dissipation fins via the heat pipe.

In order to ensure good heat conductance between the contact surfaces of the heat dissipation module and the electronic components, the heat dissipation module and a housing of the electronic device are usually mounted on two opposite sides of the electronic components, and a plurality of connecting units are provided to interconnect the electronic components, the heat dissipation module and the housing. By fastening the heat dissipation module toward the housing with the connecting units, the contact surfaces of the heat dissipation module and surfaces of the electronic components can abut tightly.

However, since the connecting units are disposed proximately to the electronic components, upon an impact on the housing, the force of the impact is easily relayed to the heat dissipation module and the electronic components through the connecting units as to cause damages thereto. In addition, due to manufacturing and assembly tolerances, poor heat dissipation efficiency would result from poor contact between the electronic components and the contact surfaces of the heat dissipation module, or alternatively, damages to the electronic components would occur if the electronic components are pressured to the contact surfaces too hard.

SUMMARY OF THE INVENTION

Therefore, an object of the present invention is to provide a connecting unit that can absorb force of a collision.

Another object of the present invention is to provide a connecting unit that can offset component tolerance(s).

Yet another object of the present invention is to provide an electronic device incorporating such connecting unit.

Therefore, according to one aspect of the present invention, there is provided an electronic device that includes a housing, an electronic unit and at least one connecting unit. The housing has an inner surface. The electronic unit is disposed in the housing and includes a board body that has one side which faces the inner surface, and that is formed with at least one first through hole. The connecting unit is for connecting the electronic unit to the housing, and includes a first connecting component, a second connecting component and a buffering member. The first connecting component is mounted to and in the housing, projects from the inner surface of the housing, and has an end face that is distal from the inner surface and that is formed with a fastening hole. The second connecting component includes a head that has a diameter greater than that of the first through hole, and that is spaced apart from the board body and disposed at a side of the board body opposite to the inner surface and the first connecting component, and a stem that is connected to the head, that has a cross-section smaller than that of the head, and that is registered with the fastening hole in the first connecting component. The buffering member is sleeved on the first connecting component, is resilient and has an end that abuts against the board body and that is formed with a mounting hole, which is registered with the fastening hole in the first connecting component. A portion of the buffering member is disposed between the first connecting component and the board body.

The stem of the second connecting component extends through the first through hole and the mounting hole to engage the fastening hole so as to secure the second connecting component to the first connecting component, such that the board body of the electronic unit abuts against the buffering member, and is spaced apart from the first connecting component and the head of the second connecting component so as to be movably restricted relative to the housing between the head of the second connecting component and the buffering member.

The effects of this invention lies in that by providing the buffering member, a portion of which is disposed between the first connecting component and the board body, and which abuts against the board body, the buffering member permits displacement of the housing relative to the electronic unit upon impact through deformation, and absorbs the force of the impact so as to protect the electronic unit. Moreover, by maintaining a certain distance between the head of the second connecting component and the board body, a space for displacement of the housing relative to the electronic unit is provided to enhance the effect of buffering the impact. Furthermore, since the board body of the electronic unit abuts against the resilient buffering member, any manufacturing or assembly tolerance associated with the electronic unit can be offset by the deformation of the buffering member to ensure proper assembly.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
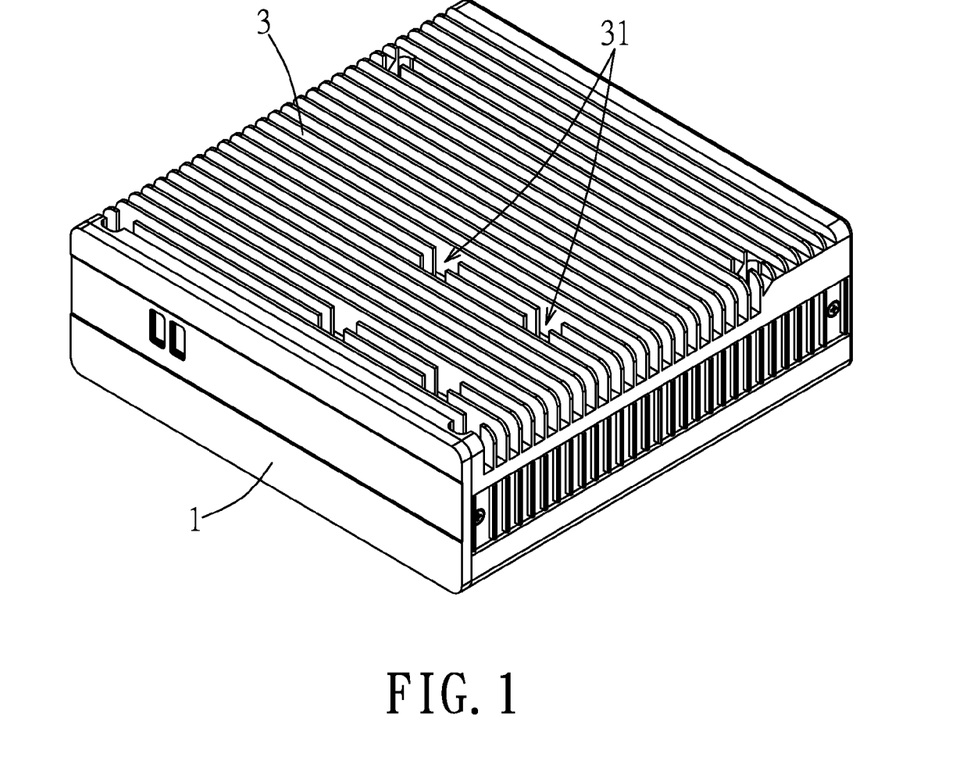
FIG. 1 is an assembled perspective view of the preferred embodiment of an electronic device with a connecting unit according to the present invention.
Figure 2:
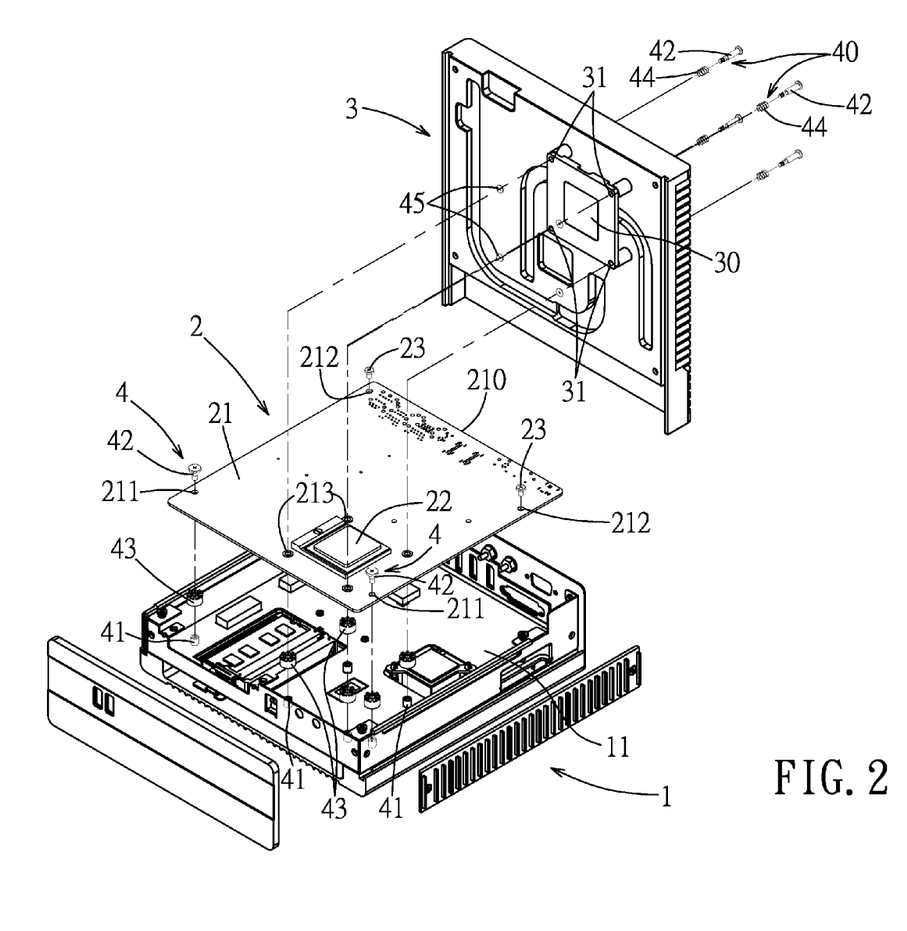
FIG. 2 is an exploded perspective view of the preferred embodiment.

With reference to FIGS. 1 and 2, the preferred embodiment of an electronic device according to the present invention is illustrated as a fanless computer host, and includes a housing 1 having an inner surface 11, an electronic unit 2 mounted in the housing 1, a heat dissipation module 3 mounted in the housing 1 and disposed on a side of the electronic unit 2 opposite to the housing 1, two connecting units 4, four auxiliary connecting units 40 and two securing members 23. The electronic unit 2 includes a board body 21 having two sides, one of which faces the inner surface 11, and an electronic component 22 mounted on the side of the board body 21 opposite to the inner surface 11. In this embodiment, the board body 21 is a motherboard, and the electronic component 22 is a central processing unit (CPU) mounted to the motherboard.

Figure 3:
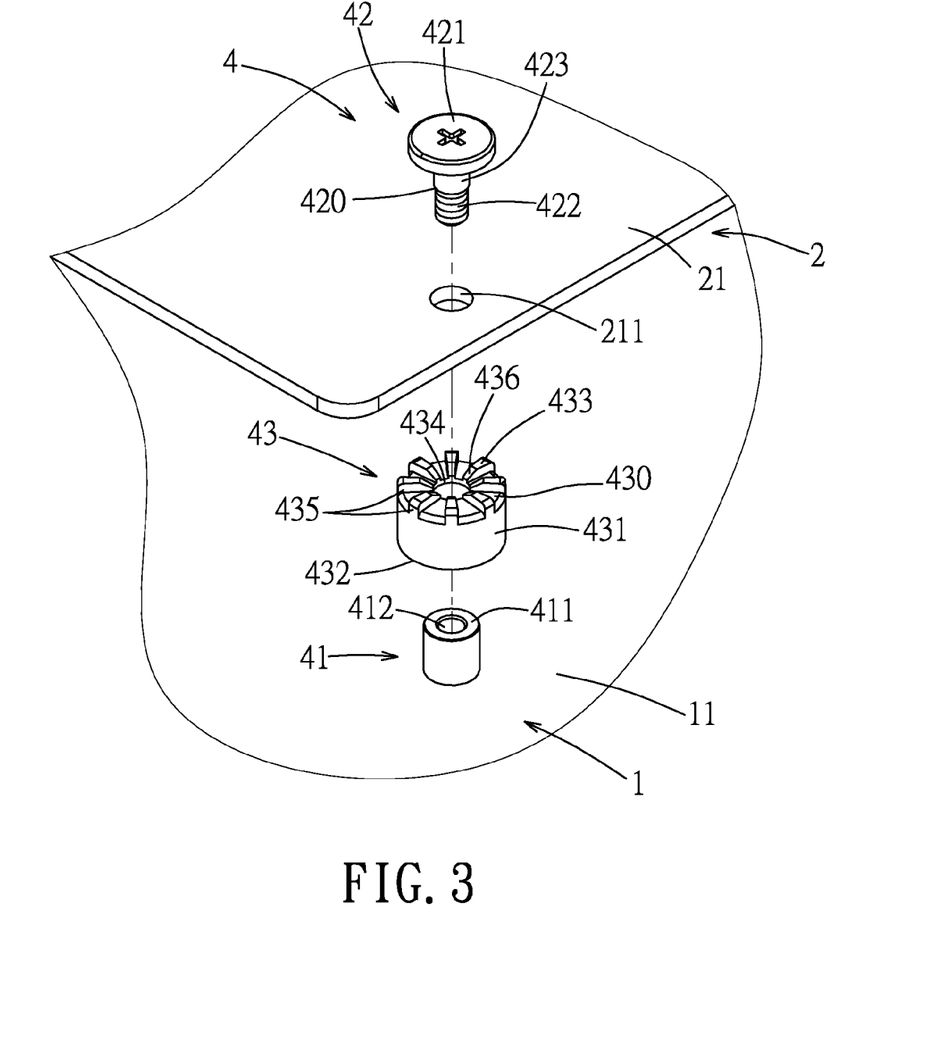
FIG. 3 is a fragmentary exploded perspective view of the preferred embodiment, illustrating the connecting unit.
Figure 7:
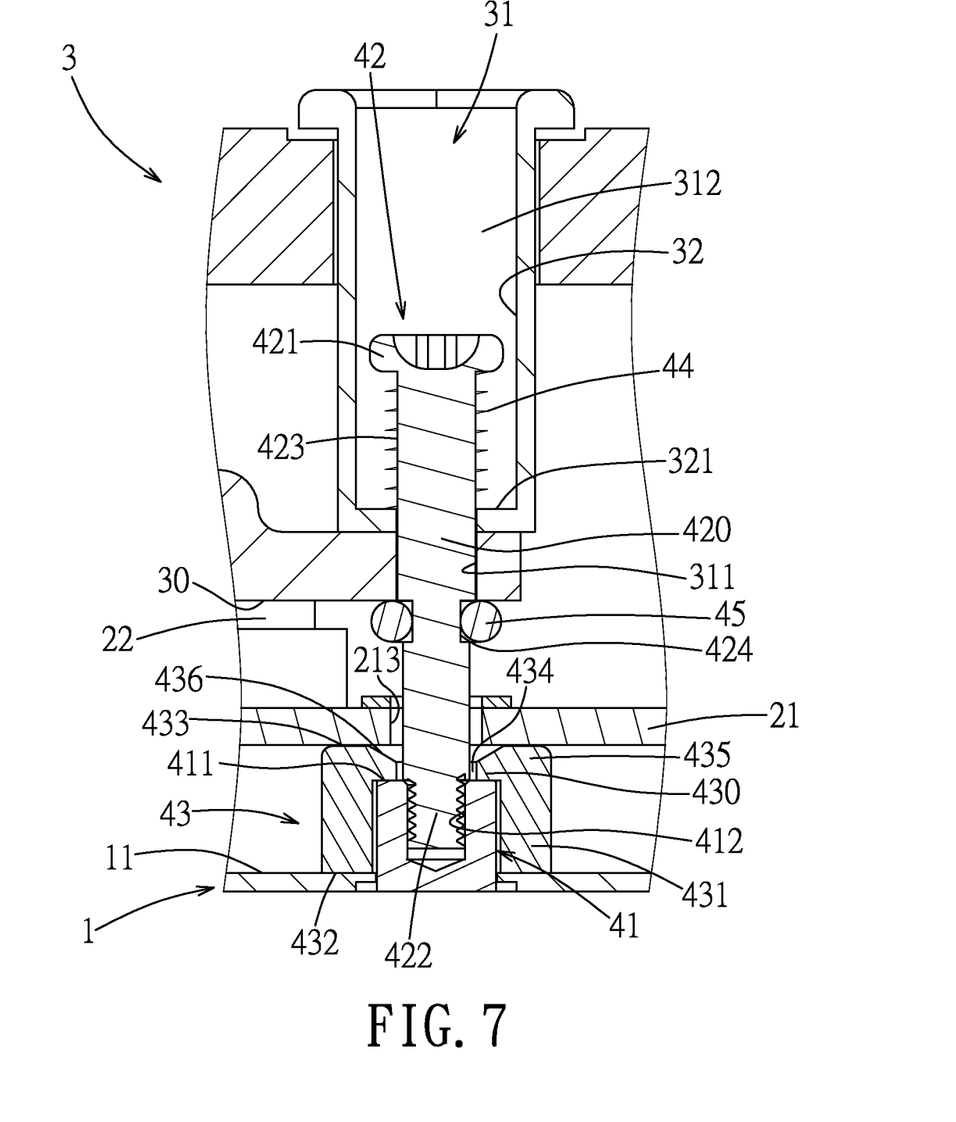
FIG. 7 is a fragmentary assembled sectional view of the preferred embodiment, illustrating the auxiliary connecting unit.

Referring to FIGS. 2, 3 and 7, the board body 21 has a securing lateral side 210, and is formed with two first through holes 211 distal from the securing lateral side 210, two securing holes 212 proximate to the securing lateral side 210, and four second through holes 213 distal from the securing lateral side 210 and surrounding the electronic component 22. The securing members 23 extend respectively through the securing holes 212 in the board body 21 and are secured to the housing 1 so as to secure the board body 21 to the housing nearby the securing lateral side 210. The heat dissipation module 3 is disposed on the side of the electronic unit 2 opposite to the inner surface 11, includes a heat dissipation surface 30 abutting tightly against the electronic component 22, and is formed with four through orifices 31. The four through orifices 31 are registered with the four second through holes 213, respectively. Each of the through orifices 31 has a small-diameter section 311 disposed proximate to the respective second through hole 213 and a large-diameter section 312 disposed distally from the respective second through hole 213. Moreover, each of the through orifices 31 is defined by an orifice-defining wall 32 that has a shoulder portion 321 between the small-diameter section 311 and the large-diameter section 312. Each of the connecting units 4 cooperates with a respective one of the first through holes 211 to connect the board body 21 of the electronic unit 2 to the housing 1 and in the housing 1, and includes a first connecting component 41 mounted to and in the housing 1 and projecting from the inner surface 11 of the housing 1, a second connecting component 42 engageable with the first connecting component 41, and a buffering member 43 sleeved on the first connecting component 41.

Figure 5:
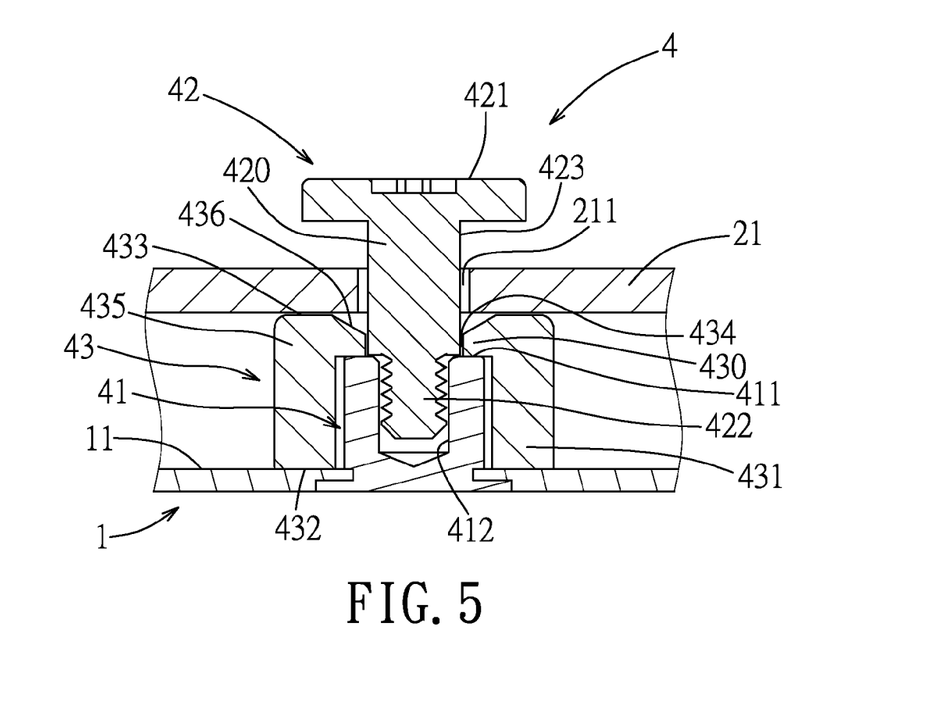
FIG. 5 is a fragmentary sectional view taken along a line V-V of FIG. 4.

Referring to FIGS. 2, 3 and 5, the first connecting component 41 of each of the connecting units 4 has an end face 411 that is distal from the inner surface 11 and that is formed with a fastening hole 412, which is a threaded hole in this embodiment. The second connecting component 42 of each of the connecting units 4 includes a head 421 and a stem 420. The diameter of the head 421 is greater than the diameter of the respective first through hole 211, and the head 421 is disposed on the side of the board body 21 opposite to the first connecting component 41 while being spaced apart from the board body 21 when the second connecting component 42 is engaged with the first connecting component 41. The stem 420 extends from the head 421 toward the first connecting component 41, has a cross section smaller than the head 421, and includes a threaded section 422 and a smooth section 423 interconnecting the threaded section 422 and the head 421.

Figure 4:
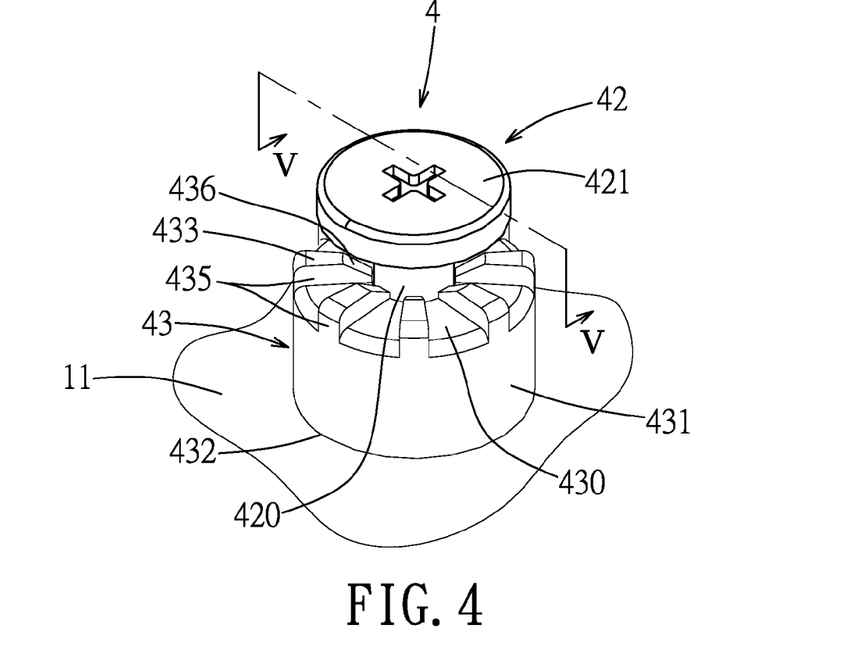
FIG. 4 is a fragmentary assembled perspective view of the preferred embodiment, illustrating the connecting unit.

Referring to FIGS. 3, 4 and 5, the buffering member 43 of each of the connecting units 4 is a resilient damper, includes a surrounding wall 431 surrounding the first connecting component 41, and a top wall 430 bending and extending from the surrounding wall 431 to abut against the end face 411 of the first connecting component 41, and has a bottom face 432 abutting against the inner surface 11 of the housing 1. The top wall 430 is formed with a mounting hole 434 registered with the fastening hole 412, and has a top face 433 disposed opposite to the bottom face 432 and abutting against the board body 21. The top wall 430 includes a plurality of spaced-apart top abutting blocks 435 surrounding the mounting hole 434 and cooperatively defining the top face 433. The distance between the top face 433 of the buffering member 43 and the inner surface 11 is greater than that between the end face 411 of the first connecting component 41 and the inner surface 11.

The smooth section 423 of the stem 420 of the second connecting component 42 extends through the respective first through hole 211 in the board body 21 and the mounting hole 434 of the buffering member 43, and the threaded section 422 of the stem 420 engages with the fastening hole 412 of the first connecting component 41. The board body 21 of the electronic unit 2 abuts against the top face 433 of the top wall 430 of the buffering member 43, and is spaced apart from the first connecting component 41 and from the head 421 of the second connecting component 42, and is restricted movably relative to the housing 1 between the head 421 of the second connecting component 42 and the top wall 430 of the buffering member 43. It is worth to mention that each of the top abutting blocks 435 has an inclined face 436 slanting downwardly from the top face 433 toward the mounting hole 434 so as to provide a guiding mechanism that facilitates smooth insertion of the stem 420 of the second connecting component 42 into the mounting hole 434.

Referring to FIG. 2 and FIG. 5, since the top and bottom faces 433, 432 of the buffering member 43 abut respectively against the board body 21 of the electronic unit 2 and the inner surface 11 of the housing when the connecting unit 4 is connected to the electronic unit 2, upon experiencing an impact in the direction toward the electronic unit 2, the buffering member 43 is deformed to allow for relative movement between the housing 1 and the electronic unit 2 and to generate a buffering effect, absorbing the force of the impact and protecting the electronic unit 2 from the impact. It is worth to mention herein that, being a resilient damper, the buffering member 43 returns to its original state quickly after absorbing the force of the impact through deformation, and unlike an ordinary elastic member, the buffering member 43 will not generate reciprocal oscillations after absorbing the force of the impact, thereby protecting the electronic component 22 of the electronic unit 2 from damage otherwise caused by the reciprocal oscillations.

The design that the top face 433 of the buffering member 43 is formed cooperatively by the top abutting blocks 435 allows for a greater resiliency in the portion of the buffering member 43 that is in contact with the board body 21, i.e., a greater degree of deformation can be generated by the buffering member 43 when the housing 1 experiences an impact, and thereby the housing 1 can have a greater displacement relative to the electronic unit 2 for further reducing the influence of the impact upon the electronic unit 2. On the other hand, when the housing 1 experiences an impact in a direction away from the board body 21 of the electronic unit 2 (i.e., in the downward direction of FIG. 5), the second connecting component 42 is brought to move in the same direction by the housing 1. Since the head 421 of the second connecting component 42 is kept a distance apart from the board body 21, room is provided to permit movement of the second connecting component 42 relative to the board body 21, thereby prevent the board body 21 from bearing the impact as the result.

Figure 6:
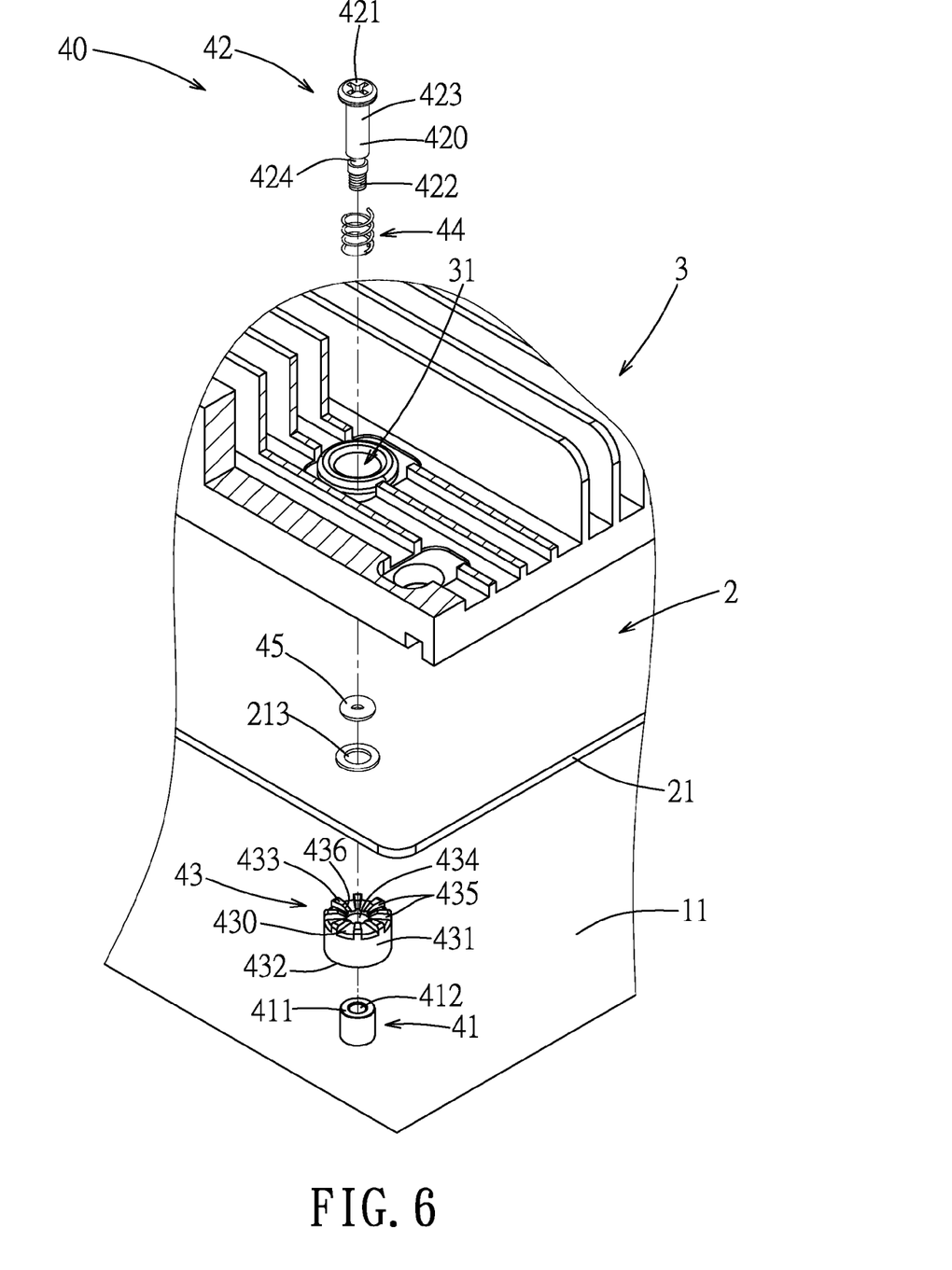
FIG. 6 is a fragmentary exploded perspective view of the preferred embodiment, illustrating an auxiliary connecting unit.

Referring to FIG. 6 and FIG. 7, each of the auxiliary connecting units 40 is similar to the connecting unit 4 in structure, and includes a first connecting component 41 mounted to and in the housing 1 and projecting from the inner surface 11 of the housing 1, a second connecting component 42 engageable with the first connecting component 41, a buffering member 43 sleeved on the first connecting component 41, an elastic member 44 and an o-ring 45. The first connecting component 41 has an end face 411 that is distal from the inner surface 11 and that is formed with a fastening hole 412, which is threaded in this embodiment. The buffering member 43 is a resilient damper, includes a surrounding wall 431 surrounding the first connecting component 41, and a top wall 430 bending and extending from the surrounding wall 431 to abut against the end face 411 of the first connecting member 41, and has a bottom face 432 abutting against the inner surface 11 of the housing 1. The top wall 430 is formed with a mounting hole 434 registered with the fastening hole 412, and has a top face 433 disposed opposite to the bottom face 432 and abutting against the board body 21. The top wall 430 includes a plurality of spaced-apart top abutting blocks 435 surrounding the mounting hole 434 and cooperatively defining the top face 433. Each of the top abutting blocks 435 has an inclined face 436 that is inclined downwardly from the top wall 430 toward the mounting hole 434. The distance between the top face 433 and the inner surface 11 is greater than that between the end face 411 of the first connecting component 41 and the inner surface 11.

The second connecting component 42 of each of the auxiliary connecting units 40 includes a head 421 and a stem 420. The head 421 is disposed in the large-diameter section 312 of the respective through orifice 31 and is spaced apart from the shoulder portion 321. The stem 420 includes a threaded section 422 and a smooth section 423 interconnecting the threaded section 422 and the head 421. The smooth section 423 extends through the respective through orifice 31, the respective second through hole 213 and the mounting hole 434, and the threaded section 422 is engaged with the fastening hole 412 of the first connecting component 41. The elastic member 44 is sleeved on the smooth section 423 of the stem 420, is disposed in the large-diameter section 312 of the respective through orifice 31, and has two ends respectively abutting against the head 421 and the shoulder portion 321 of the respective through orifice 31 so as to provide a resilient biasing force that biases the heat dissipation module 3 toward the electronic unit 2 to thereby push the heat dissipation surface 30 of the heat dissipation module 3 tightly against the electronic component 22 to maintain good heat conductance therebetween for good heat dissipation performance.

The stem 420 of the second connecting component 42 of each of the auxiliary connecting units 40 is formed with an annular groove 424. The annular groove 424 is disposed between the heat dissipation module 3 and the board body 21 for receiving the o-ring 45. The o-ring 45 has an outer diameter greater than the diameter of the small-diameter section 311 of the respective through orifice 31 so as to prevent displacement of the second connecting component 42 relative to the heat dissipation module 3 in a direction away from the board body 21, and to hence maintain the stem 420 in the respective through orifice 31, such that the second connecting component 42 will not escape from the respective through orifices 31 due to the resilient biasing force created by the elastic member 44 before being engaged to the first connecting component 41. Therefore, the overall assembly procedure becomes simpler.

It should be noted herein that, since the board body 21 of the electronic unit 2 abuts against the resilient buffering member 43 of the connecting units 4 and the auxiliary connecting units 40, deformation of the buffering members 43 can offset any manufacturing or assembly tolerance associated with the board body 21 so as to maintain the appropriate intimate contact between the electronic component 22 and the heat dissipation surface 30, to thereby avoid reduction of heat conductance efficiency. In addition, the resilient nature of the buffering members 43 prevents damage to the electronic component 22 otherwise caused by a too-tight abutment between the electronic component 22 and the heat dissipation surface 30 of the prior art.

Moreover, since the connecting units 4 and the auxiliary connecting units 40 are disposed proximate to the heat dissipation surface 30, the buffering members 43 thereof are made of heat-resistant silicone or rubber to ensure resiliency thereof while withstanding long-term exposure to heat.

Figure 8:
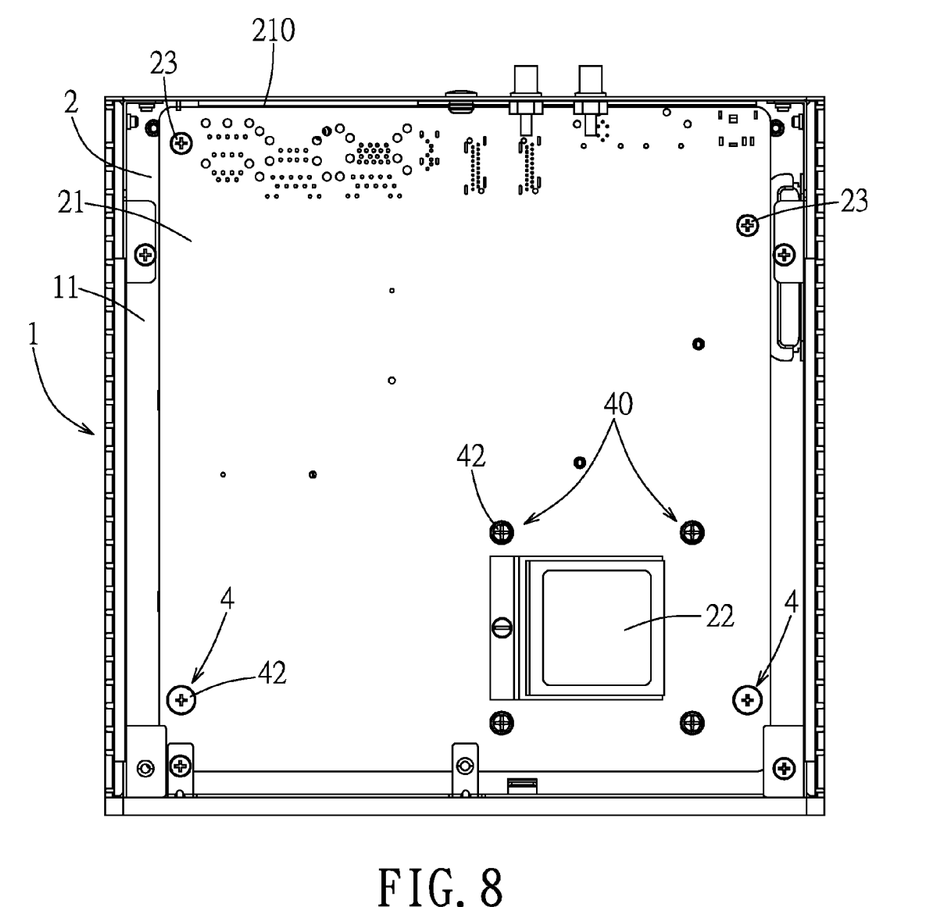
FIG. 8 is top schematic view for illustrating relationships among a plurality of securing members and a plurality of connecting units on a board body.

Referring to FIG. 2 and FIG. 8, it is worth to mention that, since the locations of the securing holes 212 in the board body 21 are proximate to the securing lateral side 210, the securing members 23 that cooperate with the securing holes 212 are also proximate to the securing lateral side 210, such that the portion of the board body 21 nearby the securing lateral side 210 is secured to the housing 1 to form a secured end. On the other hand, since the locations of the first through holes 211 and the second through holes 213 in the board body 21 are distal from the securing lateral side 210, the connecting units 4 and the auxiliary connecting units cooperating therewith are also distal from the securing lateral side 210, such that the portion of the board body 21 distal from the securing lateral side 210 is movable relative to the housing 1 to form a free end. With the provision of the secured end and the free end, when designing the electronic unit 2, any electronic component (such as the CPU 22 in this embodiment) that is more susceptible to damage upon impact or due to component tolerance can be disposed at the free end distal from the securing lateral side 210 so as to be displaceable along the vertical direction relative to the housing 1 to absorb the force of the impact or offset the component tolerance, while the secured end ensures stable bonding between the board body 21 and the housing 1 so that the board body 21 will not displace relative the housing 1 in the horizontal direction due to slight vibration of the electronic device.

In sum, in this invention, by using the top face 433 and the bottom face 432 of the resilient buffering member 43 to respectively abut against the electronic unit 2 and the housing 1, the buffering member 43 permits displacement of the housing 1 relative to the electronic unit 2 upon impact through deformation, and absorbs the force of the impact so as to protect the electronic unit 2. Moreover, since there is a space between the head 421 of the second connecting component 42 of the connecting unit 4 and the board body 21 of the electronic unit 2, the electronic unit 2 will not be moved by the second connecting component 42, i.e., a greater space for displacement of the housing 1 relative to the electronic unit 2 is provided to enhance the effect of buffering the impact.

Furthermore, since the board body 21 of the electronic unit 2 abuts against the resilient buffering member 43, any manufacturing or assembly tolerance associated with the electronic unit 2 can be offset by the deformation of the buffering member 43 to maintain an appropriate contact between the electronic component 22 and the heat dissipation surface 30 of the heat dissipation module 3, such that the poor heat dissipation efficiency caused by poor contact between the electronic component 22 and the heat dissipation surface 30 is avoided, and the damage caused by too much pressure from the heat dissipation surface 30 upon the electronic component 22 is also avoided. Therefore, the objects of this invention are served.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A connecting unit adapted to be mounted to a housing of an electronic device for connecting an electronic unit to the housing, the housing having an inner surface, the electronic unit including a board body that has one side facing the inner surface, and that is formed with a first through hole, said connecting unit comprising:
   a first connecting component adapted to be mounted to and in the housing, projecting from the inner surface of the housing, and having an end face that is distal from the inner surface and that is formed with a fastening hole;
   a second connecting component including a head and a stem that is connected to said head, that has a cross-section smaller than that of said head, and that cooperates with said fastening hole in said first connecting component; and
   a buffering member sleeved on said first connecting component, being resilient, and having an end that is adapted to abut against the board body and that is formed with a mounting hole registered with said fastening hole in said first connecting component, a portion of said buffering member being disposed between said first connecting component and the board body;
   wherein said stem of said second connecting component extends through the first through hole and said mounting hole to engage said fastening hole so as to secure said second connecting component to said first connecting component, such that the board body of the electronic unit abuts against said buffering member, and is spaced apart from said first connecting component and said head of said second connecting component so as to be movably restricted relative to the housing between said head of said second connecting component and said buffering member;
   wherein said buffering member includes a surrounding wall surrounding said first connecting component, and a top wall extending from said surrounding wall to abut against said end face of said first connecting component, and has a bottom face abutting against said inner surface, said top wall having a top face opposite to said bottom face and adapted to abut against the board body, said mounting hole being formed in said top wall; and
   wherein said top wall of said buffering member further includes a plurality of spaced-apart top abutting blocks which surround said mounting hole and cooperatively forming said top face so as to increase resiliency in the portion of said buffering member that is in contact with the board body.

2. The connecting unit as claimed in claim 1, wherein said buffering member is a resilient damper.

3. The connecting unit as claimed in claim 1, wherein each of said top abutting blocks has an inclined face that is inclined downwardly from said top face toward said mounting hole.

4. The connecting unit as claimed in claim 3, wherein said fastening hole is threaded, said stem of said second connecting component having a threaded section and a smooth section that interconnects said head and said threaded section, said threaded section meshing with said fastening hole, said smooth section being adapted to extend through the first through hole in the board body and said mounting hole in said top wall of said buffering member.

5. An electronic device comprising:
   a housing having an inner surface;
   an electronic unit disposed in said housing and including a board body that has one side which faces said inner surface, and that is formed with at least one first through hole; and
   at least one connecting unit for connecting said electronic unit to said housing, said connecting unit including
      a first connecting component mounted to and in said housing, projecting from said inner surface of said housing, and having an end face that is distal from said inner surface and that is formed with a fastening hole,
      a second connecting component including a head that has a diameter greater than that of said first through hole, and that is spaced apart from said board body and disposed at a side of said board body opposite to said inner surface and said first connecting component, and a stem that is connected to said head, that has a cross-section smaller than that of said head, and that is registered with said fastening hole in said first connecting component, and
      a buffering member sleeved on said first connecting component, being resilient and having an end that abuts against said board body and that is formed with a mounting hole, which is registered with said fastening hole in said first connecting component, a portion of said buffering member being disposed between said first connecting component and said board body;
   wherein said stem of said second connecting component extends through said first through hole and said mounting hole to engage said fastening hole so as to secure said second connecting component to said first connecting component, such that said board body of said electronic unit abuts against said buffering member, and is spaced apart from said first connecting component and said head of said second connecting component so as to be movably restricted relative to said housing between said head of said second connecting component and said buffering member;
   wherein said buffering member includes a surrounding wall surrounding said first connecting component, and a top wall extending from said surrounding wall to abut against said end face of said first connecting component, and has a bottom face abutting against said inner surface, said top wall having a top face opposite to said bottom face and abutting against said board body, said mounting hole being formed in said top wall, the distance between said top face and said inner surface being larger than that between said end face of said first connecting component and said inner surface;

wherein said top wall of said buffering member further includes a plurality of spaced-apart top abutting blocks surrounding said mounting hole, and cooperatively forming said top face so as to increase resiliency in the portion of said buffering member that is in contact with the board body.

6. The electronic device as claimed in claim 5, wherein said buffering member is a resilient damper.

7. The electronic device as claimed in claim 5, wherein each of said top abutting blocks has an inclined face that is inclined downwardly from said top face toward said mounting hole.

8. The electronic device as claimed in claim 7, wherein said electronic unit further includes an electronic component mounted on another side of said board body opposite to said inner surface, said board body being formed with at least one second through hole;

said electronic device further comprising a heat dissipation module disposed to abut against said electronic component, and at least one auxiliary connecting unit, said heat dissipation module being formed with at least one through orifice that is registered with said second through hole, said through orifice having a small-diameter section disposed proximate to said second through hole and a large-diameter section disposed distally from said second through hole, said through orifice being defined by an orifice-defining wall that forms a shoulder portion between said small-diameter section and said large-diameter section, said auxiliary connecting unit including a first connecting component that is mounted to and in said housing and that projects from said inner surface of said housing, a second connecting component, a buffering member that is sleeved on said first connecting component, and an elastic member, said first connecting component having an end surface that is distal from said inner surface and that is formed with a fastening hole, said buffering member including a surrounding wall that surrounds said first connecting component and a top wall that extends from said surrounding wall to abut against said end face of said first connecting component, and having a bottom face that abuts against said inner surface, said top wall having a top face that is opposite to said bottom face and that abuts against said board body, said mounting hole being formed in said top wall, the distance between said top face and said inner surface being greater than that between said end face of said first connecting component and said inner surface, said second connecting component including a head that is disposed in said large-diameter section of said through orifice and that is spaced apart from said shoulder portion, and a stem that is connected to said head, that extends through said through orifice, said second through hole and said mounting hole to engage said fastening hole in said first connecting component as to be secure said second connecting component to said first connecting component, said elastic member being sleeved on said stem of said second connecting component and having two ends that respectively abut against said head and said shoulder portion so as to provide a resilient biasing force that biases said heat dissipation module toward said electronic unit.

9. The electronic device as claimed in claim 8, wherein said stem of said second connecting component of said auxiliary connecting unit is formed with an annular groove that is disposed between said heat dissipation module and said board body, said auxiliary connecting unit further including an o-ring disposed in said annular groove, said o-ring having an outer diameter that is greater than the diameter of said small-diameter section of said through orifice.

10. The electronic device as claimed in claim 9, wherein said fastening holes of said connecting unit and said auxiliary connecting unit are threaded, said stem of said second connecting component of each of said connecting unit and said auxiliary connecting unit having a threaded section and a smooth section interconnecting said head and said threaded section, said threaded section meshing with said fastening holes of said first connecting component of the corresponding one of said connecting unit and said auxiliary connecting unit.

11. The electronic device as claimed in claim 10, wherein said buffering member of each of said connecting unit and said auxiliary connecting unit is made of one of a heat-resistant silicone and a heat-resistant rubber.

12. The electronic device as claimed in claim 11, wherein said board body of said electronic unit is a motherboard, and said electronic component of said electronic unit is a central processing unit.

13. The electronic device as claimed in claim 12, further comprising a plurality of securing members for securing said board body of said electronic unit to said housing, said board body having a securing lateral side, said securing members of said electronic device being disposed proximate to said securing lateral side such that the portion of said board body nearby said securing lateral side is fixed to said housing so as to form a secured end, said connecting unit, said auxiliary connecting unit and said electronic component being disposed distally from said securing lateral side so that the portion of said board body distal from said securing lateral side is permitted to displace relative to said housing so as to form a free end.

14. The electronic device as claimed in claim 13, comprising a plurality of said connecting units and a plurality of said auxiliary connecting units, said board body of said electronic unit being formed with a plurality of said first through holes for said second connecting components of said connecting unit to extend therethrough and a plurality of second through holes for said second connecting components of said auxiliary connecting unit to extend therethrough, said heat dissipation module being formed with a plurality of said through orifices for said second connecting components of said auxiliary connecting unit to extend therethrough.

* * * * *